United States Patent
Randazzo

(10) Patent No.: US 7,457,090 B2
(45) Date of Patent: Nov. 25, 2008

(54) USE OF A KNOWN COMMON-MODE VOLTAGE FOR INPUT OVERVOLTAGE PROTECTION IN PSEUDO-DIFFERENTIAL RECEIVERS

(75) Inventor: Todd A. Randazzo, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 245 days.

(21) Appl. No.: 10/988,122

(22) Filed: Nov. 12, 2004

(65) Prior Publication Data

US 2006/0103999 A1    May 18, 2006

(51) Int. Cl.
*H02H 3/20* (2006.01)
*H02H 9/04* (2006.01)
(52) U.S. Cl. ..................................... 361/91.1
(58) Field of Classification Search ................. 361/91.1
See application file for complete search history.

(56) References Cited

U.S. PATENT DOCUMENTS

| | | | | |
|---|---|---|---|---|
| 5,159,260 | A * | 10/1992 | Yoh et al. | 323/313 |
| 7,233,201 | B2 * | 6/2007 | King et al. | 330/252 |
| 2005/0195543 | A1 * | 9/2005 | Lundberg | 361/91.1 |

FOREIGN PATENT DOCUMENTS

JP    06237124 A * 8/1994

* cited by examiner

*Primary Examiner*—Stephen W Jackson
*Assistant Examiner*—Ann T Hoang
(74) *Attorney, Agent, or Firm*—Westman, Champlin & Kelly, P.A.

(57) ABSTRACT

A method and apparatus are provided for protecting elements of a receiver from overvoltages in a pseudo-differential signal having a true signal and a reference voltage. The method and apparatus limit the true signal to a protection voltage, which is correlated to the reference voltage, to produce a protected true signal. The protected true signal and the reference voltage are applied to inputs of the receiver.

17 Claims, 7 Drawing Sheets

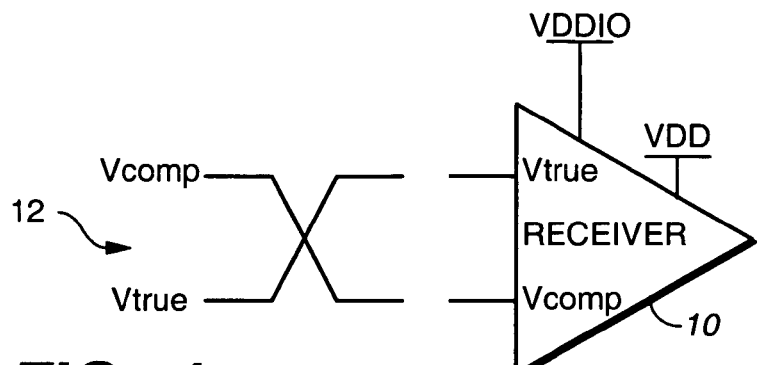
FIG._1
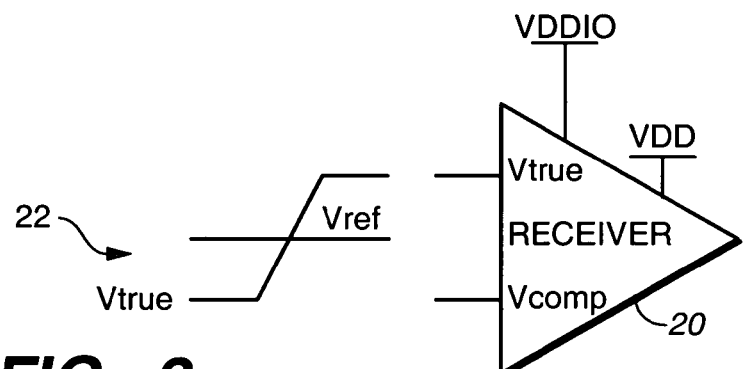
FIG._2
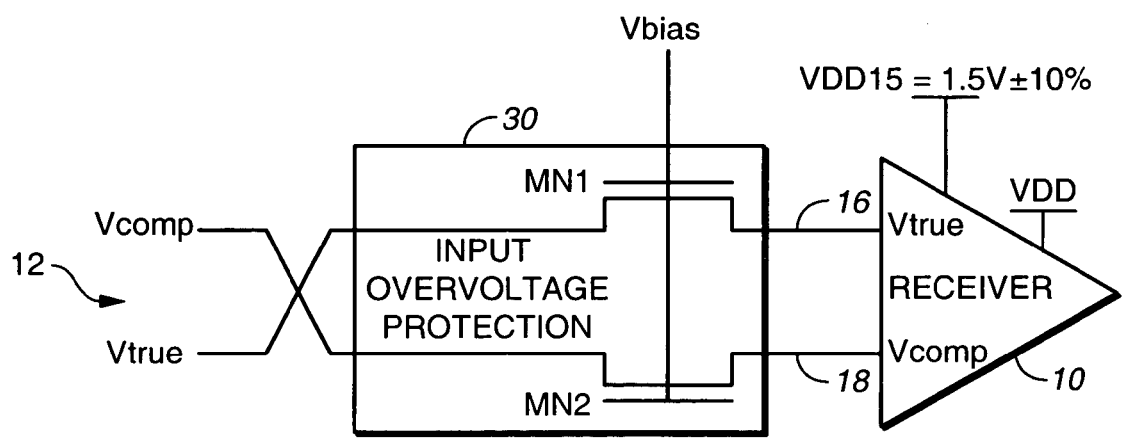
FIG._3

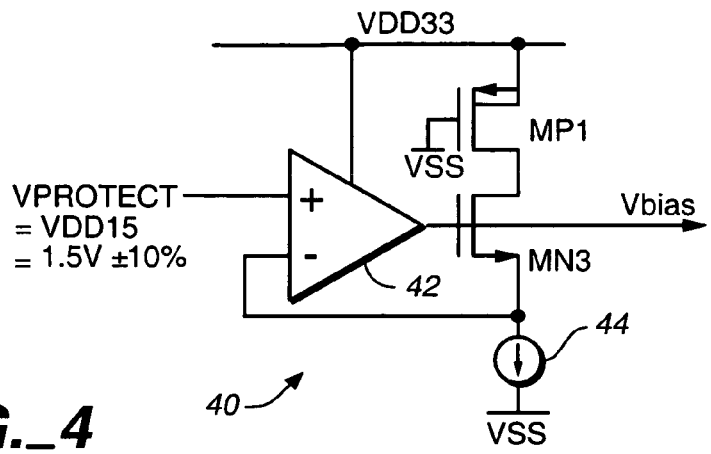
FIG._4
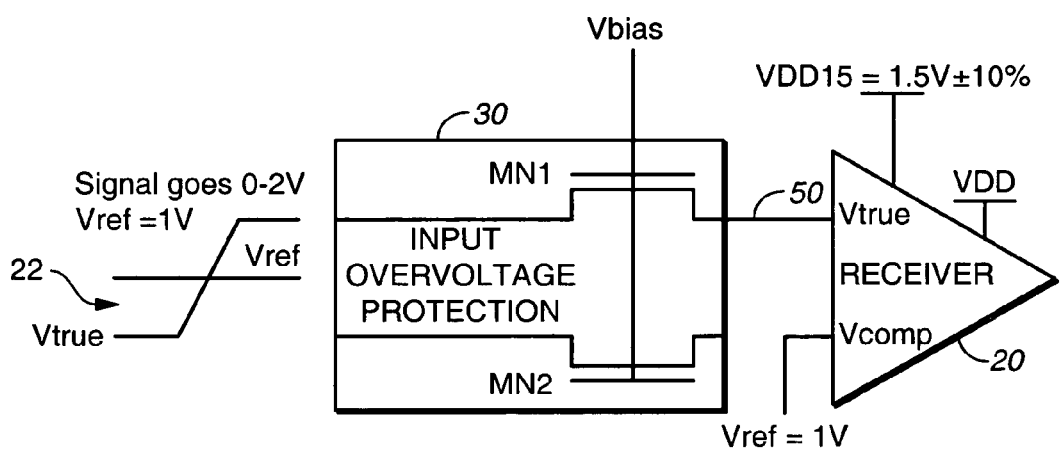
FIG._5
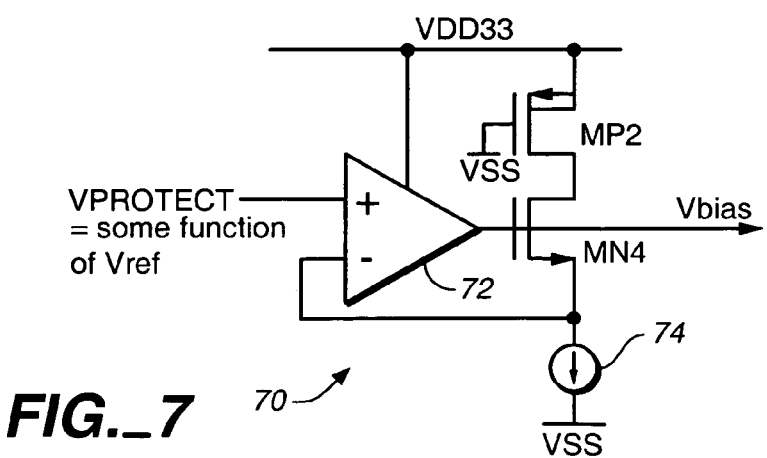
FIG._7

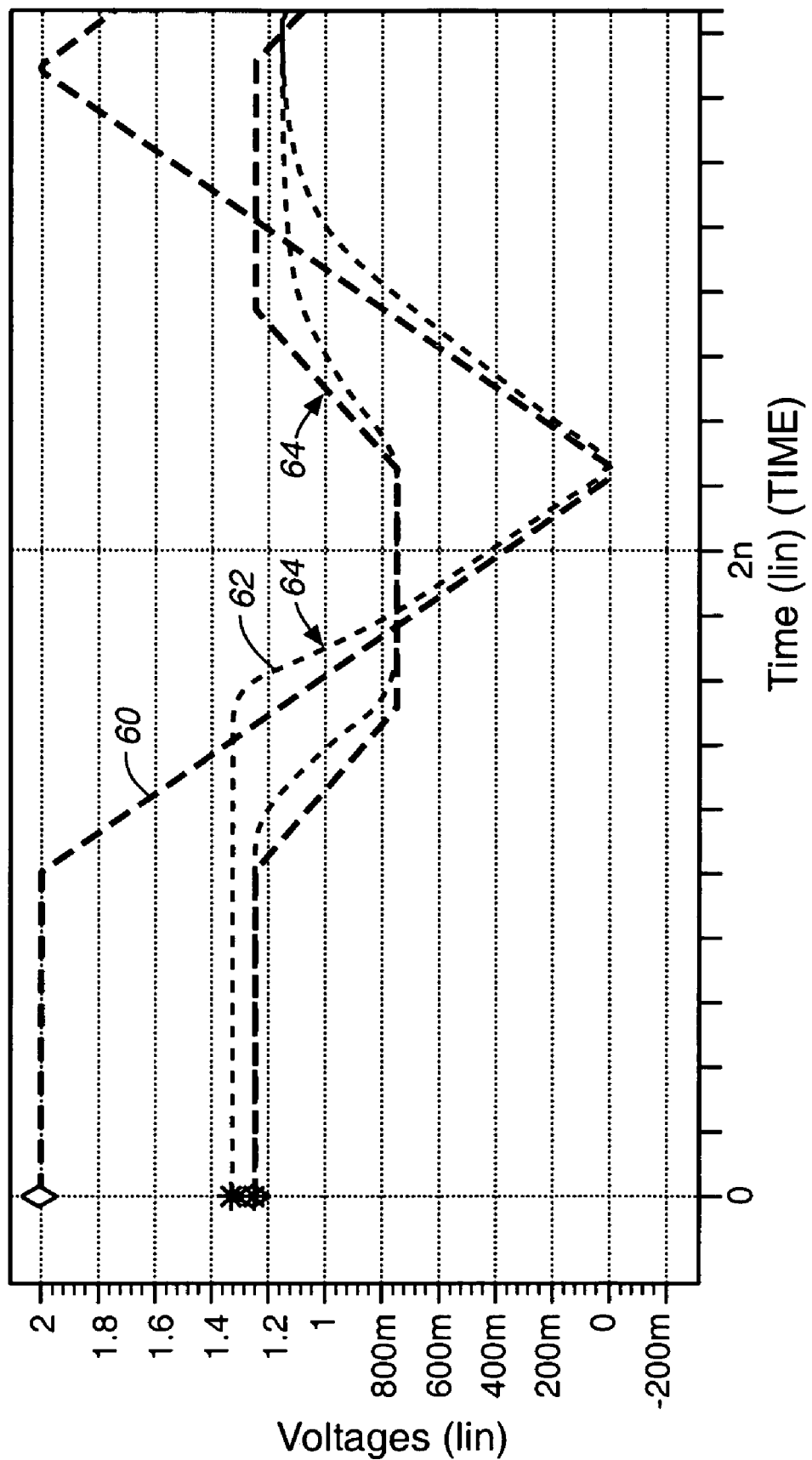
FIG._6

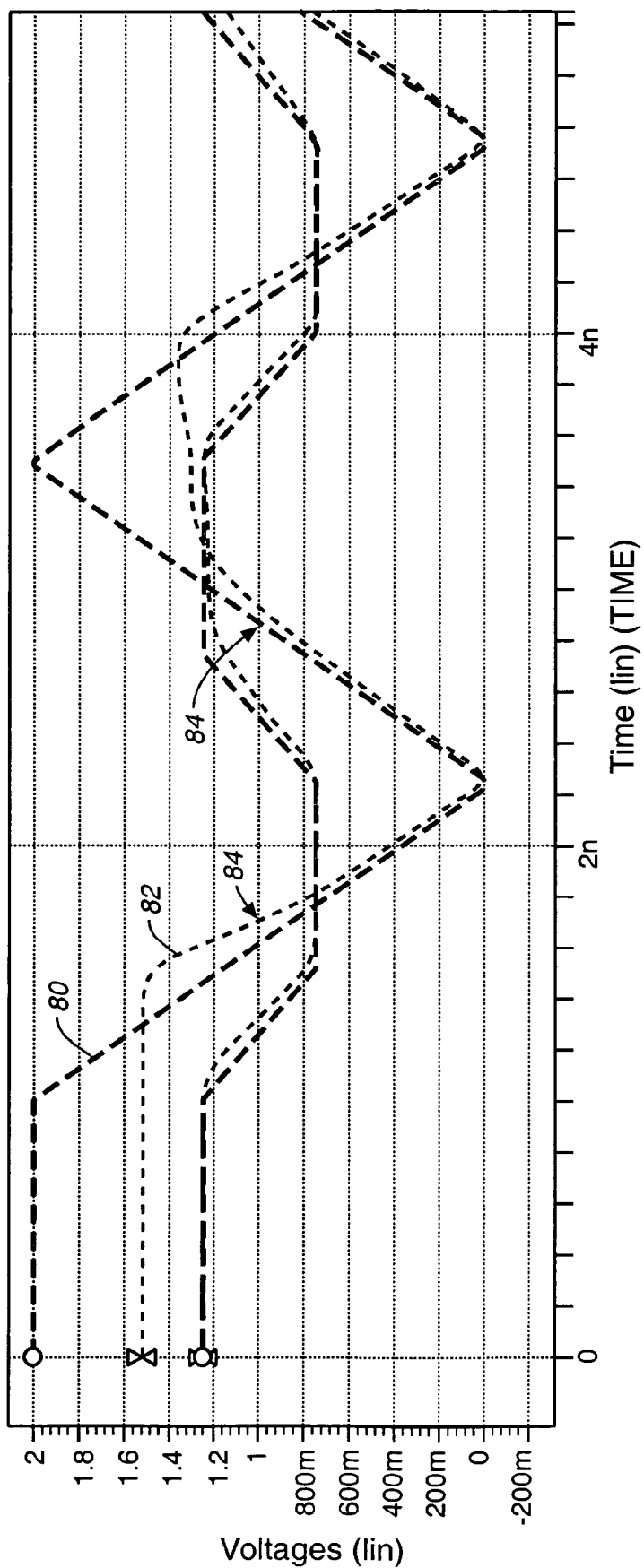
FIG._8

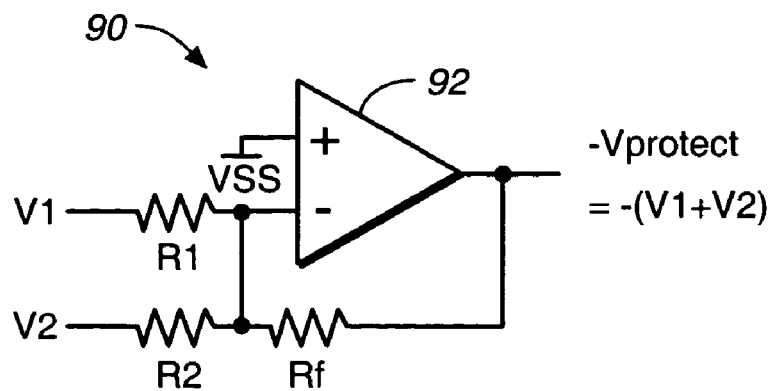
FIG._9
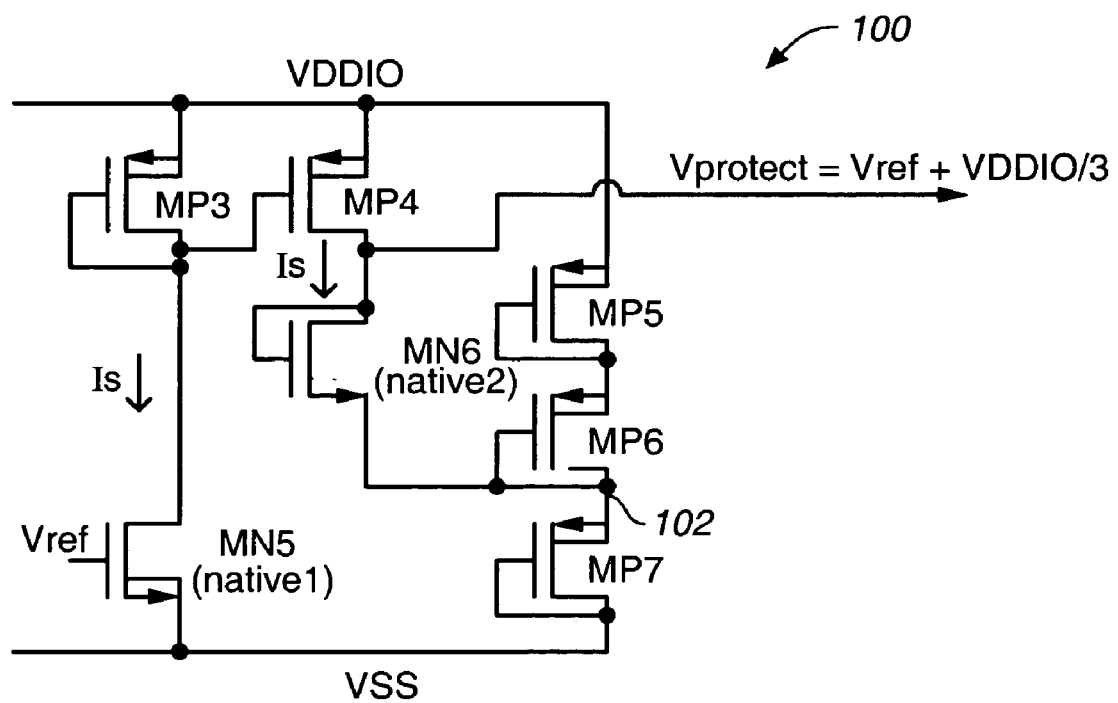
FIG._10

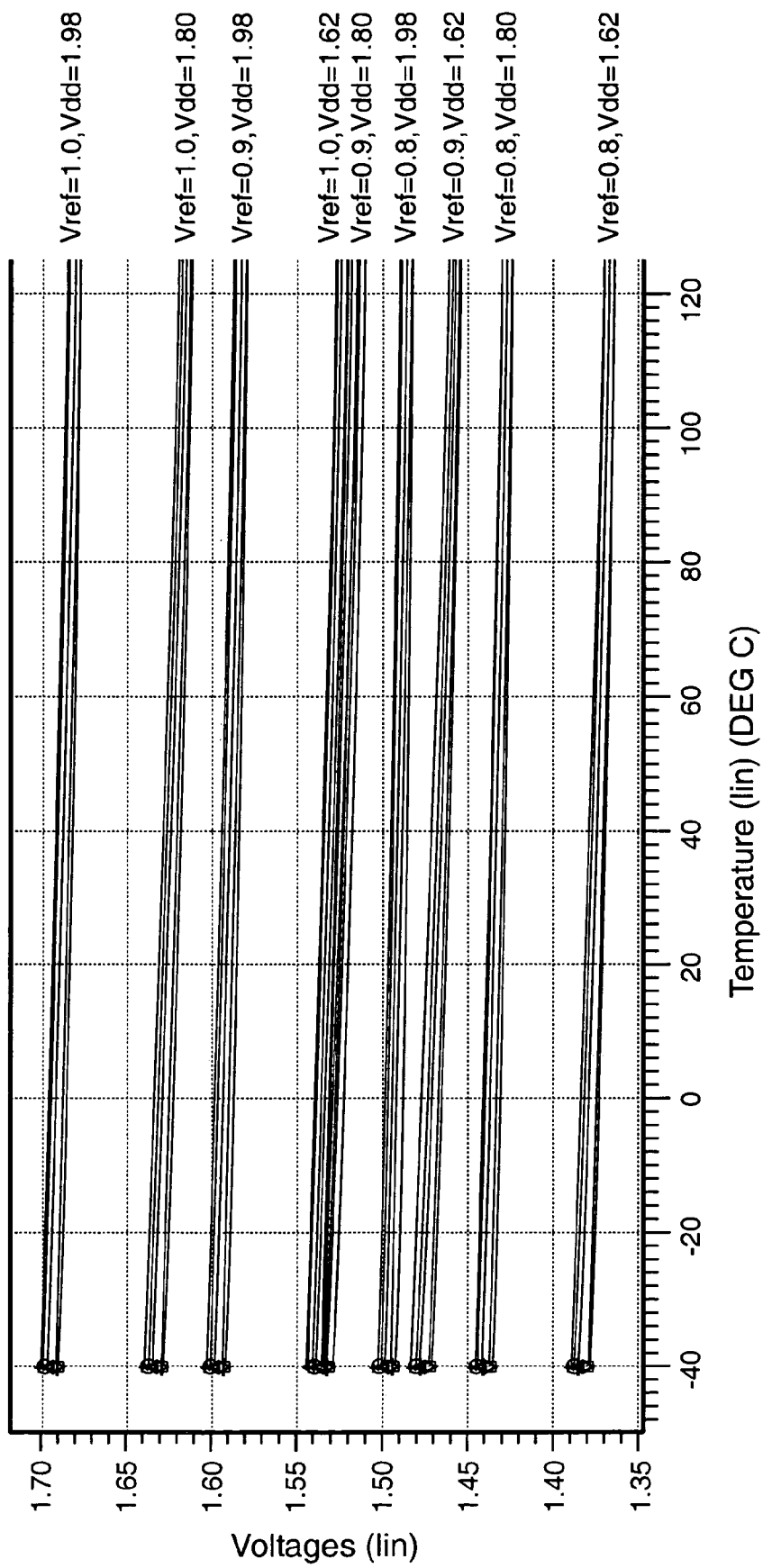
FIG._11

USE OF A KNOWN COMMON-MODE VOLTAGE FOR INPUT OVERVOLTAGE PROTECTION IN PSEUDO-DIFFERENTIAL RECEIVERS

CROSS-REFERENCE TO RELATED APPLICATION

The present application is related to U.S. patent application Ser. No. 10/988,156, entitled "METHOD AND APPARATUS FOR SUMMING DC VOLTAGES" and filed on Nov. 12, 2004.

FIELD OF THE INVENTION

The present invention relates to semiconductor integrated circuits and, in particular to differential receivers and the protection of low voltage input devices against large input voltages.

BACKGROUND OF THE INVENTION

Advancements in semiconductor fabrication technology enable the geometries of semiconductor devices to be progressively reduced so that more devices can fit on a single integrated circuit. As a result, core voltages of integrated circuits are being reduced to prevent damage to the small devices and to reduce overall power consumption. For example, power supplies are now being reduced from 3.3 volts to much lower voltages such as 2.5 volts, 1.8 volts and 1.5 volts. However, these low voltage devices are often interconnected at a board level to other devices that may operate at higher supply voltages. Also, these devices may be exposed to reflections and other events causing voltage spikes that can damage these small devices.

Semiconductor integrated circuits therefore often include some sort of protection against large input voltages. For example, an integrated circuit having a differential or pseudo-differential receiver can incorporate voltage-tolerant transistors within the receiver, which can handle larger input voltage swings and can provide a buffer to the smaller, more fragile core devices on the integrated circuit. However, voltage-tolerant transistors typically have lower performance and consume a larger silicon area and more power than a typical transistor.

In the design of high performance receivers, it is advantageous if the fastest, smallest transistors that are available in the technology can be used for the receiver. These transistors have the highest switching speeds and consume the least area and power. Often, however, the fastest transistors available in a technology are low-voltage transistors, which may not be able to directly tolerate certain signal levels. When this is the case, some sort of over-voltage protection network is required to prevent destructive voltages from reaching the low-voltage transistors in the receiver.

An example of an input overvoltage protection circuit includes a pass gate, which clamps the differential input signals to a desired voltage. For example, a receiver can be constructed from 1.5V±10% transistors and used in a two-volt signaling environment. The pass gate protection circuit can use an internally generated bias voltage to limit the differential input signal to a maximum of 1.5±10%.

However with low operating voltages, this type of a protection circuit can be difficult to implement. If the voltage to which the signal is limited is less than the zero-crossing point of the differential signals, the receiver may never trip. If the voltage limit is greater than the zero-crossing point but simply to close to the zero-cross point, then the input protection circuit can introduce a large timing distortion to the input signals, which reduces performance of the receiver. Improved overvoltage protection circuits are therefore desired for integrated circuit applications such as differential or pseudo-differential receivers. Improved bias generators are also desired for generating the bias voltages used by the protection circuit without consuming a relatively large area and power.

SUMMARY OF THE INVENTION

One embodiment of the present invention is directed to a method of protecting elements of a receiver from overvoltages. The method includes: receiving a pseudo-differential signal comprising a true signal and a reference voltage; limiting the true signal to a protection voltage, which is correlated to the reference voltage, to produce a protected true signal; and applying the protected true signal and the reference voltage to the receiver.

Another embodiment of the present invention is directed to a method of protecting a receiver from overvoltages. The method includes: receiving a pseudo-differential signal comprising a true signal and a reference voltage; summing the reference voltage with another voltage to produce a protection voltage; limiting the true signal to the protection voltage to produce a protected true signal; and applying the protected true signal and the reference voltage to the receiver.

Another embodiment of the present invention is directed to a pseudo-differential receiver system. The system includes a pseudo-differential signal input, a bias generator, a voltage protection circuit and a receiver. The pseudo-differential signal input includes a true signal input and a reference voltage input. The bias generator generates a bias voltage as a function of a voltage on the reference voltage input. The voltage protection circuit is coupled to the true signal input and has a protected true signal output that is limited to a protection voltage as a function of the bias voltage. The receiver includes true and complement inputs, which are coupled to the protected true signal output and the reference voltage input, respectively.

BRIEF DESCRIPTION OF THE DRAWINGS

FIG. 1 is a diagram illustrating a full-differential receiver.

FIG. 2 is a diagram illustrating a pseudo-differential receiver.

FIG. 3 is a diagram illustrating an input overvoltage protection circuit coupled to the full-differential receiver shown in FIG. 1.

FIG. 4 is a diagram illustrating a bias circuit for generating a bias voltage for the protection circuit shown in FIG. 3.

FIG. 5 is a diagram illustrating an input overvoltage protection circuit coupled to the pseudo-differential amplifier shown in FIG. 2.

FIG. 6 is a graph illustrating timing distortion that can be introduced by the overvoltage protection circuit.

FIG. 7 is a diagram illustrating a voltage bias circuit, which bases the bias voltage for the protection circuit on the reference voltage from a pseudo-differential input signal.

FIG. 8 is a graph illustrating reduced timing distortion achieved with the bias circuit shown in FIG. 7.

FIG. 9 is a schematic diagram illustrating a DC summing circuit, which can be used for generating a protection voltage in accordance with one embodiment of the present invention.

FIG. 10 is a schematic diagram illustrating a DC voltage summing circuit according to an alternative embodiment of the present invention.

FIG. 11 is a graph illustrating the output of the voltage summing circuit shown in FIG. 10 versus temperature for a range of manufacturing tolerances.

DETAILED DESCRIPTION OF ILLUSTRATIVE EMBODIMENTS

Figure 12:
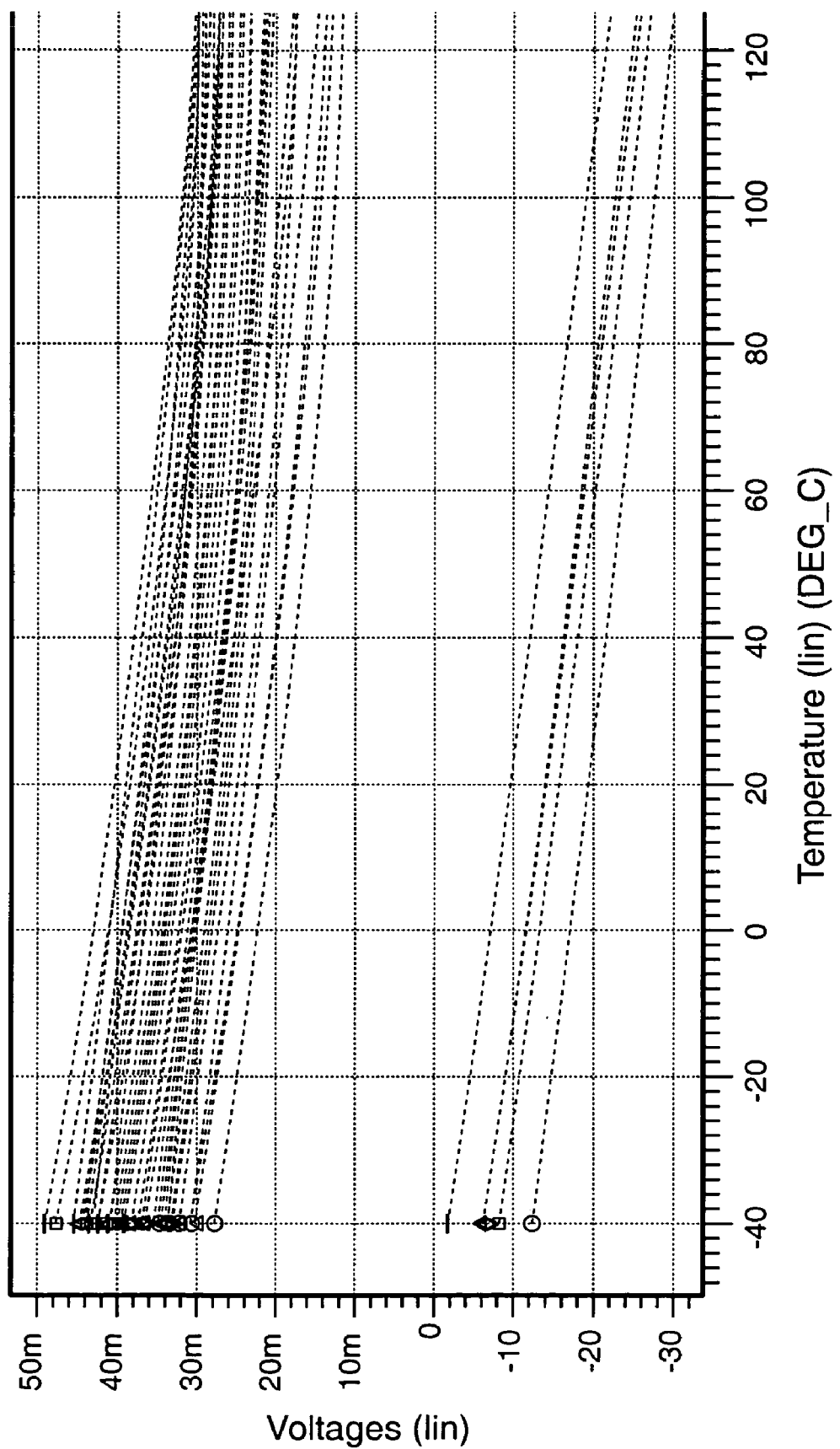
FIG. 12 is a graph illustrating the difference between an ideal output voltage and the actual output of the circuit shown in FIG. 10 over a wide range of voltage tolerances.

According to one embodiment of the present invention, an over-voltage protection circuit is provided, which limits the input voltages of the receiver to a voltage that is based on a known common-mode voltage in a pseudo-differential signaling environment. In recent years, "pseudo-differential" signaling has become increasing popular for transmitting signals from one location to another. Pseudo-differential signaling has many of the benefits of full-differential signaling, but requires approximately half of the pins (or number of required electrical connections) as compared to full-differential signaling.

FIG. 1 is a diagram illustrating a typical full-differential receiver 10 on an integrated circuit. The integrated circuit has a pair of input pins 12, labeled "Vtrue" and "Vcomp" for receiving a pair of true and complement differential input signals, respectively. Differential receiver 10 includes true and complement voltage inputs labeled "Vtrue" and "Vcomp" for receiving the true and complement signals from pins 12. During operation, receiver 10 outputs a logic low or "0" level when Vtrue<Vcomp, and outputs a logic high or "1" level when Vtrue>Vcomp. The common-mode or "zero-crossing" voltage, Vcommon-mode, of the differential input signal occurs wherever Vtrue=Vcomp.

The integrated circuit has a voltage supply rail VDDIO and a corresponding ground supply rail (not shown in FIG. 1) for biasing the transistors in the input-output region of the integrated circuit, including the input transistors within receiver 10. The integrated circuit can also have other voltage supplies, such as a core voltage supply VDD for biasing the transistors in the core region of the integrated circuit. The voltage level on VDDIO is typically higher than the core supply voltage.

The full differential receiver 10 shown in FIG. 1 requires two electrical input connections (pins 12) for each differential signal path. Therefore, a 32-bit wide bus would require 64 signal pins.

FIG. 2 is a diagram illustrating a pseudo-differential receiver 20, having a pair of input pins 22, labeled "Vtrue" and "Vref" for receiving a true input signal and a reference voltage, respectively. Receiver 20 includes true and complement voltage inputs labeled "Vtrue" and "Vcomp" for receiving the true and reference signals from pins 22. During operation, receiver 20 outputs a logic low or "0" level when Vtrue<Vref, and outputs a logic high or "1" level when Vtrue>Vref.

Unlike the full-differential signaling environment, the common-mode or "zero-crossing" voltage, Vcommon-mode, of the pseudo-differential input signal is fixed at Vref. Since Vref is fixed, a pseudo-differential signal requires only one electrical connection for each data path, plus one connection for the reference voltage. Therefore, a 32-bit wide bus would require 32 input pins plus a Vref pin. As result, pseudo-differential receivers have approximately half the "pin count" (or required number of electrical connections) as compared to full-differential receivers.

In the design of high performance receivers, it is advantageous of the fastest, smallest transistors available in the technology can be used within the receiver. These transistors have the highest speed and consume the least area and power. However, the fastest transistors in a technology are often low-voltage transistors, which may not be able to tolerate certain signal levels directly. When this is the case, some sort of over-voltage protection circuit is used to prevent destructive voltages from reaching the low-voltage transistors.

FIG. 3 is a diagram illustrating an input overvoltage protection circuit 30 coupled between the full-differential receiver 10 (shown in FIG. 1) and the differential input pins 12. In this example, protection circuit 30 includes a pair of pass gate transistors MN1 and MN2, which are coupled in series with the differential input pins 12. Pass gate transistors MN1 and MN2 have their control inputs, or gates, coupled to a bias voltage Vbias. The bias voltage Vbias is set such that the voltages applied to the Vtrue and Vcomp inputs of differential receiver 10, at nodes 16 and 18, do not exceed a predetermined protection voltage, Vprotection.

With protection circuit 30, receiver 10 can be constructed from faster, low-voltage transistors, which are biased between a lower supply voltage, such as VDD15, having a voltage of 1.5v±10%. In this example, the differential input signals received on Vtrue and Vcomp swing between 0V and 2V. Vbias is therefore set to limit the voltages at the inputs of receiver 10 to 1.5V±10%.

FIG. 4 is a schematic diagram illustrating a bias circuit 40 for generating the bias voltage Vbias for protection circuit 30. Bias circuit 40 includes amplifier 42, current source 44, P-channel transistor MP1 and N-channel transistor MN3. Amplifier 42 is biased between a 3.3 volt supply rail VDD33 and ground supply rail VSS. The non-inverting input of amplifier 42 is coupled to the protection voltage Vprotect, which is the desired voltage to which the incoming differential signal should be limited. For the example shown in FIG. 3, Vprotect is coupled to voltage supply rail VDD 15, which has an actual voltage of 1.5v 10%.

Amplifier 42 has an output coupled to the gate of transistor MN3 and to bias output Vbias. Transistor MN3 is coupled in series with transistor MP1 between voltage supply terminal VDD33 and current source 44. Current source 44 is coupled between the source of MN3 and VSS. The source of transistor MN3 is coupled in a feedback path to the inverting input of amplifier 42. The gate of MP1 is coupled to VSS.

During operation, amplifier 42 adjusts the voltage level on its output at the gate of transistor MN3 such that the source of MN3 is forced to 1.5V±10%. Current source 44 preferably supplies a current that is less than the input bias current of receiver 10. Since the gates of transistors MN1 and MN2 in FIG. 3 are coupled to the same bias voltage as the gate of MN3 and the transistors have roughly the same drain-source current levels, the sources of transistors MN1 and MN2 are limited to 1.5V±10%.

FIG. 5 is a diagram illustrating input voltage protection circuit 30 coupled to the pseudo-differential amplifier 20 shown in FIG. 2. In this example, the reference voltage Vref=1V and data signal Vtrue varies between 0V and 2V. The data signal Vtrue is passed through protection circuit 30 to the Vtrue input of receiver 20. The reference voltage Vref is coupled to the Vcomp input of receiver 20, which therefore resides at 1V.

Protection circuit 30 limits the voltage on node 50 to Vprotect based on the bias voltage Vbias. For example as described with reference to FIG. 4, Vbias can be set to limit the voltage on node 50 to 1.5V±10%. With protection circuit 30, the input elements of receiver 20 can be implemented with low-voltage transistors, which are biased between VDD15 and VSS.

In both the differential amplifier shown in FIG. 3 and the pseudo-differential amplifier in FIG. 5, fluctuations in the supply voltage levels due to tolerances can cause the voltage to which the input signals are limited to approach the zero-crossing voltage. If Vprotect is less than the zero-crossing voltage (Vcommon-mode or Vref), the receiver will never trip. Even if Vprotect is greater than but close to the zero-crossing voltage, input protection circuit 30 can introduce a large timing distortion to the input signals. The protection voltage Vprotect should therefore be set as high above the zero-crossing voltage as possible while still protecting the small input devices within the receiver from damaging voltage levels.

FIG. 6 is a graph illustrating timing distortion that can be introduced by voltage protection circuit 30 when the bias voltage Vbias is based solely on the voltage of a voltage supply rail, such as VDD15, within the integrated circuit. The timing distortion is greatest when Vref is highest (Vref=1V) and Vprotect is lowest (Vprotect=VDD15=1.35V). In FIG. 6, waveform 60 represents the voltage on unprotected input pin Vtrue in FIG. 5, and waveform 62 represents the protected Vtrue on node 50 after protection circuit 30.

With Vprotect set at 1.5V±10%, the lowest value of Vprotect is therefore 1.35V, which is close to the 1V zero-crossing voltage on Vref. This results in timing distortion and delay, shown at arrows 64, as Vtrue crosses the common-mode voltage. The response at the output of protection circuit 30 becomes distorted relative to the response at the input, particularly when Vprotect comes close to the common-mode voltage.

1. Correlating the Protection Voltage to the Known Common-Mode Voltage

In one embodiment of the present invention, the timing distortion through the voltage protection circuit is minimized by correlating the protection voltage to the actual common-mode voltage. If the common-mode voltage is higher in a particular system environment, the protection voltage also increases, thereby maintaining a sufficient "head room" between the two values.

In pseudo-differential signaling environments, the common-mode, zero-crossing voltage Vref is known. Using this information, the protection voltage Vprotect can be based in whole or in part on Vref itself rather than on some other voltage in the system. By doing so, the difference between Vprotect and the zero-crossing voltage can be maximized.

FIG. 7 is a diagram illustrating a voltage bias circuit 70 according to one embodiment of the present invention. Bias circuit 70 includes amplifier 72, current source 74, P-channel transistor MP2 and N-channel transistor MN4. Voltage bias circuit 70 is similar to voltage bias circuit 40 shown in FIG. 4, but the non-inverting input of amplifier 72 is coupled to a protection voltage level Vprotect, which is a function of Vref (as opposed to some other voltage level in the system). Amplifier 72 sets the voltage level on Vbias such that the protected Vtrue voltage on node 50 (FIG. 5) is limited to Vprotect.

In the above example, the input transistors in pseudo-differential receiver 20 can tolerate 1.5V±10%. The power supply voltages have 10% tolerances, and Vref can range from 0.8V to 1.0V. Table 1 shows sample comparisons of the difference between Vprotect and Vzero-crossing for different functions of Vprotect, where Vmax is the absolute maximum voltage the receiver can tolerate.

TABLE 1

| OPTION | Vmax | Vprotect − Vzero-cross |
|---|---|---|
| Base Vprotect on any ±10% supply (say VDD15) | 1.65 V | 350 mV (when Vref = 1 & VDD15 = 1.35 V) |
| Base Vprotect on a multiplied ±5% bandgap reference | 1.65 V | 492 mV (when Vref = 1 & Vbgap is low) |
| Base Vprotect purely on Vref (say 1.65*Vref) | 1.65 V | 520 mV (when Vref = 0.8 V) |
| Base Vprotect on Vref & VDD15 (say Vref + 0.39*VDD15) | 1.65 V | 532 mV (when VDD15 = 1.35 V) |

As shown in Table 1, the least clearance between Vprotect and Vzero-crossing is achieved when Vprotect is based on any ±10% supply voltage, such as the VDD15 supply voltage. When Vref=1V and VDD15=1.35V, the difference between these two voltages is only 350 mV. Similarly, the difference between Vprotect and Vzero-crossing is only 492 mV when Vprotect is based on a bandgap reference.

A much greater clearance can be achieved when Vprotect is based on Vref. For example if Vprotect is based purely on Vref, such as Vprotect=1.65*vref, the difference between Vprotect and Vzero-crossing is 520 mV when Vref=0.8 v. When Vprotect is based on Vref and VDD15, such as Vprotect=Vref+0.39*VDD15, the difference between Vprotect and Vzero-crossing rises to a maximum of 532 mV, and yet the receiver inputs are still protected to 1.65V. The greater the difference between Vprotect and Vzero-crossing, the smaller the timing distortion on the protected Vtrue.

FIG. 8 is a graph illustrating reduced timing distortion when Vprotect is based at least in part on Vref. Waveform 80 represents the voltage on the Vtrue input pin, and waveform 82 represents protected Vtrue voltage level after the pass gate, on node 50. Arrows 84 represent the reduced timing distortion between these two voltage levels at the zero-crossing point relative to the timing distortion shown in FIG. 6. In the example shown in FIG. 8, the bias voltage Vbias was set to limit the receiver input to Vprotect=Vref+0.394*VDD15. Since Vprotect is based on Vref rather than on some other voltage in the system uncorrelated to Vref, timing distortion is reduced as expected.

As mentioned above, it is highly desirable to use low voltage transistors in moderate-voltage signaling environments. However an input overvoltage protection network that is based simply on the maximum voltage that the transistors will tolerate may render the receiver non-functional or may introduce lots of signal distortion. In pseudo-differential environments, the protection circuit can take advantage of the fact that the zero-crossing voltage Vref is known. By basing the protection voltage in whole or in part on Vref rather than on some other voltage in the system, the difference between Vprotect and Vzero-crossing can be maximized while minimizing signal distortion.

The protection circuit 30 shown in FIG. 5 is simply one example of a protection circuit that can be used in accordance with the present invention. Other overvoltage protection circuits can also be used in alternative embodiments. For example, an active clamp can be used to clamp the input voltages based at least in part on the zero-crossing voltage. Any overvoltage protection circuit can be used that limits the input voltages seen by the receiver to a voltage that is based at least in part on the reference voltage of a pseudo-differential signal.

Similarly, the bias circuits shown in FIGS. 4 and 7 are examples of bias circuit that can be used in accordance with the present invention. Other bias circuits can be used in alternative embodiments of the present invention.

2. DC Voltage Summing Circuit

A variety of circuits can be used to generate the appropriate voltage level on Vprotect as a function of Vref, in accordance with the present invention. For example, a DC voltage summing circuit can be used to sum Vref with some other voltage level in the system, such as a fraction of a power supply voltage.

FIG. 9 is a schematic diagram illustrating a DC summing circuit 90, which can be used for generating Vprotect in accordance with one embodiment of the present invention. Summing circuit 90 includes voltage inputs V1 and V2, input resistors R1 and R2, feedback resistor Rf, amplifier 92 and output Vprotect. The non-inverting input of amplifier 92 is coupled to VSS. The inverting input of amplifier 92 is coupled to voltage inputs V1 and V2 through input resistors R1 and R2, respectively. Feedback resistor Rf is coupled between Vprotect and the inverting inputs of amplifier 92.

With the circuit shown in FIG. 9, $$-V\text{protect} = -((Rf/R1)(v1) + (Rf/R2)(V2)) \quad \text{Eq. 1}$$

Therefore if V1 is coupled to Vref and V2 is coupled to a suitable supply voltage rail, the values of R1, R2 and Rf can be selected such that summing circuit 90 adds Vref to a desired fraction of the power supply voltage.

However since summing circuit 90 is typically implemented with an operational amplifier, circuit 90 consumes a relatively large amount of power and area. Also, if the input resistors draw an unacceptable level of current off of Vref, an additional buffering operational amplifier may also be required. This further increases the power and area consumed by the circuit.

FIG. 10 is a schematic diagram illustrating a DC voltage summing circuit 100 according to another embodiment of the present invention, which consumes much less power and area than variations on the circuit shown in FIG. 9. Summing circuit 100 includes N-channel transistors MN5 and MN6 and P-channel transistors MP3-MP7. Transistors MN5 and MN6 are native MOS devices having very low gate-source thresholds and body effects (gamma). For example, transistors MN5 and MN6 can have near zero gate-source voltages, such as in the range of 0.1V to 0.3V or lower. In one embodiment, MN5 and MN6 are substantially identical to one another.

Transistor MN5 operates as a current source and has a gate coupled to the reference voltage Vref, a source coupled to Vss and a drain coupled to the gate and drain of MP3. The setup voltage on Vref generates a setup current Is into the drain of transistor MN5.

Transistors MP3 and MP4 are coupled together to form a current mirror, which mirrors the setup current Is from the drain of transistor MP3 to the drain of transistor MP4. Transistor MP3 has a gate and drain coupled to the drain of transistor MN5 and a source coupled to voltage supply terminal VDDIO. Transistor MP4 has a gate coupled to the gate and drain of MP3, a drain coupled to the gate and drain of MN6 and a source coupled to VDDIO. The source of transistor MN6 is coupled to node 102. The gate and drain of MN6 are also coupled to voltage output Vprotect.

As long as the voltage drop across the current mirror transistor MP3 is small enough to keep the drain voltage on native device MN5 above all values of Vref, then MN5 stays in saturation and Vref determines the setup current Is. If the setup current is small compared to the current going through voltage divider transistors MP5-MP7, then the other native device MN6 will have the same gate-source voltage Vgs, where Vgs=Vref. Thus, the voltage on Vprotect is the sum of the gate-source voltage of MN6 (Vref) and the voltage on node 102. Node 102 therefore serves as a DC voltage input, which is summed with the first DC voltage input, Vref, to produce Vprotect.

Any suitable voltage can be applied to node 102 by any suitable circuit. In the embodiment shown in FIG. 10, transistors MP5, MP6 and MP7 are coupled in series with one another to form a voltage divider between VDDIO and VSS. Transistor MP5 has a source coupled to VDDIO and a gate and drain coupled to the source of MP6. Transistor MP6 has a gate and drain coupled to node 102 and to the source of MP7. Transistor MP7 has a gate and drain coupled to VSS.

Transistors MP5-MP7 divide the voltage on VDDIO by substantially a factor of three, such that the voltage on node 102 is substantially VDDIO/3. The number and sizes of MP5-MP7 depend upon what fraction of VDDIO we want to add to Vref. In one embodiment, it was found that the most desirable voltage on Vprotect was Vref+VDDIO/3, where VDDIO was an available 1.8V±10% voltage supply level. The voltage divider therefore generates the "VDDIO/3" term on node 102. The factor of three was based primarily on the value of Vref, the voltage tolerances of the transistors used in the receiver, and the available voltage supply level to be divided. Any other suitable factor of a supply voltage can also be used in alternative embodiments. In one alternative embodiment, the voltage on node 102 is generated by some other type of bias voltage generator and based on an available voltage level in the system.

As long as the setup current (Is) is small compared to the current going through voltage divider transistors MP5-MP7, a fairly accurate sum of Vref and VDDIO/3 can be generated on Vprotect with this simple circuit.

FIG. 11 is a graph illustrating the output of voltage summing circuit 100 versus temperature for a range of manufacturing tolerances. Each cluster of curves in FIG. 11 represents a specific value of Vref and VDDIO. Each cluster has only about 30 mV of variation over a wide range of temperature and process conditions. The resulting protection voltage generated by the circuit is therefore very stable over these variables.

FIG. 12 is a graph illustrating the difference between ideal output voltage Videal (Vref+VDDIO/3) and the actual output of the circuit over a wide range of VDDIO and Vref values. Videal-Vprotect is plotted of a function of temperature for all manufacturing tolerances and nine combinations of Vref (0.8V, 0.9V and 1.0V) and VDDIO (1.62V, 1.80V and 1.98V). As shown in FIG. 12, the output Vprotect remains within 50 mV of the target voltage, Videal.

The difference from the ideal voltage can be further reduced at the expense of increased DC power by using larger transistor devices and a greater ratio of current in the voltage divider to the setup current Is. Further accuracy can be obtained if the native N-channel devices can reside in their own Pwells to eliminate the body effect.

The DC voltage summing circuit shown in FIG. 10 is therefore capable of accurately summing a DC voltage with some fraction of a power supply voltage or other voltage level. Such a DC voltage summing circuit can be used in a variety of applications, such as for generating the most appropriate reference voltage for an input overvoltage protection circuit. The DC voltage summing circuit consumes a significantly reduced area and power compared to conventional DC summing circuits.

Although the present invention has been described with reference to preferred embodiments, workers skilled in the art will recognize that changes may be made in form and detail without departing from the spirit and scope of the invention.

What is claimed is:

1. A method comprising:
   receiving a transmitted pseudo-differential signal from a data bus at input pins of an integrated circuit, the pseudo-differential signal comprising a true signal and a reference voltage, which were transmitted together over the data bus from a first location to the integrated circuit;
   generating a protection voltage on the integrated circuit from the reference voltage such that an increase in the reference voltage causes an increase in the protection voltage and a decrease in the reference voltage causes a decrease in the protection voltage;
   limiting the true signal to the protection voltage to produce a protected true signal; and
   applying the protected true signal and the reference voltage to a receiver on the integrated circuit.

2. The method of claim 1 wherein the steps of generating and limiting comprises:
   generating a bias voltage, which is at least partly a function of the reference voltage; and
   applying the true signal to a voltage protection circuit, which limits the voltage of the protected true signal to the protection voltage based on the bias voltage.

3. The method of claim 2 wherein the step of applying the true signal to a voltage protection circuit comprises:
   applying the true signal to a pass gate, which is controlled by the bias voltage.

4. The method of claim 2 wherein the step of generating a bias voltage comprises:
   generating the protection voltage based on the reference voltage; and
   generating the bias voltage as a function of the protection voltage such that the voltage protection circuit limits the protected true signal to the protection voltage.

5. The method of claim 4 wherein the step of generating the protection voltage comprise:
   summing the reference voltage with another voltage.

6. The method of claim 5 wherein the step of summing comprises:
   dividing a supply voltage by a factor to produce a fraction of the supply voltage; and
   summing the reference voltage with the fraction of the supply voltage to produce the protection voltage.

7. The method of claim 1 wherein the steps of generating and limiting comprises:
   summing the reference voltage with another voltage to produce the protection voltage; and
   limiting the protected true signal to the protection voltage.

8. A method comprising:
   receiving a pseudo-differential signal from a data bus at input pins of an integrated circuit, the pseudo-differential signal comprising a true signal and a reference voltage, which is a common-mode voltage of the pseudo-differential signal;
   generating a protection voltage on the integrated circuit from the reference voltage by summing the reference voltage with another voltage on the integrated circuit to produce the protection voltage such that an increase in the reference voltage causes an increase in the protection voltage and a decrease in the reference voltage causes a decrease in the protection voltage;
   limiting the true signal to the protection voltage to produce a protected true signal; and
   applying the protected true signal and the reference voltage to a receiver on the integrated circuit.

9. The method of claim 8 wherein the steps of generating and limiting comprise:
   generating a bias voltage as a function of the protection voltage; and
   applying the true signal to a voltage protection circuit, which limits the protected true signal to the protection voltage based on the bias voltage.

10. The method of claim 9 wherein the step of applying the true signal to a voltage protection circuit comprises:
    applying the true signal to a pass gate, which is controlled by the bias voltage.

11. The method of claim 10 wherein the step of generating a bias voltage comprises:
    generating a gate voltage as a function of the protection voltage and applying the gate voltage to a transistor in the pass gate such that an output of the transistor produces the protected true signal, which is limited to the protection voltage.

12. The method of claim 8 wherein the step of summing comprises:
    dividing a supply voltage by a factor to produce a fraction of the supply voltage; and
    summing the reference voltage with the fraction of the supply voltage to produce the protection voltage.

13. An integrated circuit comprising
    a pseudo-differential signal input comprising a true signal input pin and a reference voltage input pin;
    a bias generator on the integrated circuit, which generates a bias voltage as a function of a voltage received on the reference voltage input pin such that the bias voltage changes with changes in the reference voltage;
    a voltage protection circuit on the integrated circuit, which is coupled to the true signal input pin and having a protected true signal output that is limited to a protection voltage as a function of the bias voltage; and
    a receiver having true and complement inputs coupled to receive the protected true signal output and the reference voltage, respectively.

14. The integrated circuit of claim 13 wherein the bias generator comprises:
    an output transistor having a gate and a feedback output; and
    an amplifier that compares the feedback output to the protection voltage and generates the bias voltage on the gate such that the feedback output is forced toward the protection voltage, which is at least partly a function of the reference voltage.

15. The integrated circuit of claim 13 wherein the bias generator comprises:
    a DC voltage summing circuit, which sums the voltage on the reference voltage input pin with another voltage on the integrated circuit to produce the protection voltage, and wherein the bias generator generates the bias voltage as a function of the protection voltage.

16. The integrated circuit of claim 15 wherein the DC voltage summing circuit sums the voltage on the reference voltage input pin with a fraction of a supply voltage on the integrated circuit to produce the protection voltage.

17. The integrated circuit of claim 13 wherein the voltage protection circuit comprises a pass gate, which is coupled in series between the true signal input pin and the protected signal output and has a control terminal coupled to the bias voltage.

* * * * *